United States Patent
Tu et al.

(10) Patent No.: US 11,476,114 B2
(45) Date of Patent: Oct. 18, 2022

(54) EPITAXIAL GROWTH PROCESS FOR SEMICONDUCTOR DEVICE AND SEMICONDUCTOR DEVICE COMPRISING EPITAXIAL LAYER FORMED BY ADOPTING THE SAME

(71) Applicant: Shanghai Huali Integrated Circuit Corporation, Shanghai (CN)

(72) Inventors: Huojin Tu, Shanghai (CN); Qin Deng, Shanghai (CN); Jueyang Liu, Shanghai (CN); Zhanyuan Hu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 66 days.

(21) Appl. No.: 17/141,341

(22) Filed: Jan. 5, 2021

(65) Prior Publication Data

US 2021/0398805 A1     Dec. 23, 2021

(30) Foreign Application Priority Data

Jun. 18, 2020   (CN) .......................... 202010558356.2

(51) Int. Cl.
*H01L 21/02* (2006.01)
*H01L 21/20* (2006.01)
*H01L 21/8234* (2006.01)
*H01L 29/66* (2006.01)
*H01L 29/78* (2006.01)
(Continued)

(52) U.S. Cl.
CPC ........ *H01L 21/02293* (2013.01); *H01L 21/20* (2013.01); *H01L 21/823418* (2013.01)

(58) Field of Classification Search
CPC ............... H01L 21/02293; H01L 21/20; H01L 21/0262; H01L 29/7848; H01L 29/66545; H01L 21/823425; H01L 29/0843–0891; H01L 29/66636–66643; H01L 21/823418–823425; H01L 21/823814; H01L 21/823412; H01L 21/823807; H01L 29/66492; H01L 29/7833–7836; H01L 29/78621–78627; H01L 29/66575–66598; H01L 29/66515; H01L 29/41783

See application file for complete search history.

(56) References Cited

U.S. PATENT DOCUMENTS

2017/0179257 A1\* 6/2017 Chou .................. H01L 29/7848
2019/0006507 A1\* 1/2019 Ma ..................... H01L 21/02532
(Continued)

*Primary Examiner* — Sonya McCall-Shepard
(74) *Attorney, Agent, or Firm* — Banner & Witcoff, Ltd.

(57) ABSTRACT

An epitaxial growth process for a semiconductor device includes providing a semiconductor substrate, forming a plurality of Dummy Gate structures on the surface of the semiconductor substrate, and forming grooves in a self-aligned manner on both sides of the Dummy Gate structures; forming an initial seed layer on the inner side surfaces of the grooves, the thickness of the formed initial seed layer on the bottoms of the grooves being greater and the thickness of the formed initial seed layer on the sidewalls being smaller since the growth speed of crystal faces <100> and <110> is different; longitudinally etching the initial seed layer to thin the bottom of the initial seed layer to form a seed layer; forming a main body layer on the seed layer, the main body layer filling the grooves; and forming a cover layer on the main body layer.

17 Claims, 5 Drawing Sheets

(51) Int. Cl.
*H01L 29/165* (2006.01)
*H01L 21/306* (2006.01)

(56) References Cited

U.S. PATENT DOCUMENTS

2019/0157425 A1* 5/2019 Liu .................... H01L 29/0847
2019/0165141 A1* 5/2019 Tsai .................... H01L 21/223
2019/0267471 A1* 8/2019 Chan .................. H01L 29/7851

* cited by examiner

Providing a semiconductor substrate, form a plurality of Dummy Gate structures on the surface of the semiconductor substrate, and forming grooves in a self-aligned manner on both sides of the Dummy Gate structures through an etching process Forming an initial seed layer on the inner side surfaces of the grooves through an epitaxial growth process, the thickness of the formed initial seed layer on the bottoms of the grooves being greater and the thickness of the formed initial seed layer on the sidewalls being smaller since the growth speed of crystal faces <100> and <110> is different Performing an etching process to longitudinally etch the initial seed layer to thin the bottom of the initial seed layer to form a seed layer Forming a main body layer on the seed layer through an epitaxial growth process, the main body layer filling the grooves Forming a cover layer on the main body layer through an epitaxial growth process

FIG. 2

EPITAXIAL GROWTH PROCESS FOR SEMICONDUCTOR DEVICE AND SEMICONDUCTOR DEVICE COMPRISING EPITAXIAL LAYER FORMED BY ADOPTING THE SAME

CROSS-REFERENCE TO RELATED APPLICATIONS

This application claims priority to Chinese Patent Application No. CN 202010558356.2 filed on Jun. 18, 2020, and entitled "Epitaxial Growth Process for Semiconductor Device and Semiconductor Device Comprising Epitaxial Layer Formed by Adopting the Same", the disclosure of which is incorporated herein by reference in its entirety.

TECHNICAL FIELD

The disclosure relates to a semiconductor integrated circuit manufacturing technology, and in particular to a source and drain region epitaxial growth process for a semiconductor device.

BACKGROUND

With the development of semiconductor technology, the Critical Dimension (CD) of devices is becoming smaller and smaller. When the process node of devices is smaller than 28 nm, it is often necessary to use embedded epitaxial layers in source and drain regions to change the stress in a channel region, so as to improve the mobility of carriers and the performance of devices.

Please refer to FIG. 1a to FIG. 1d. FIG. 1a to FIG. 1d illustrate schematic sectional views of a device in an embedded epitaxial layer forming process in the prior art. Referring to FIG. 1a, after Dummy Gate structures 120 of the device are formed, grooves 110 are usually formed in the two sides of the Dummy Gate structures 120 of a semiconductor substrate 100, and the grooves are usually in a Σ-shaped structure or a U-shaped structure. Description will be made below by taking the grooves 110 in the U-shaped structure as an example.

The Dummy Gate structures 120 are usually stacking structures of gate dielectric layers and polysilicon gates. With the development of technology, at the process node smaller than 28 nm, the gate structures are usually HKMG structures. HK represents high dielectric constant layer, that is, the gate dielectric layers are high dielectric constant layers, and MG represents metal layer. When the HKMG is used, Dummy Gate structures are usually formed on the semiconductor substrate. The Dummy Gate structures are formed by stacking structures of gate dielectric layers and polysilicon gates. Then, the self-alignment definition of the Dummy Gate structures is used to form grooves on both sides of the Dummy Gate structures, embedded epitaxial layers are formed in the grooves, and a source region and a drain region are formed in the embedded epitaxial layers through source and drain implantation. In the subsequent process, the Dummy Gate structures are removed, and then HKMG is formed in the area where the Dummy Gate structures are removed.

Usually, a hard mask layer 122 is formed on the top of polysilicon gates 121 of the gate structures or Dummy Gate structures, it further includes sidewalls 123 on the two sides of the polysilicon layers 121 and a hard mask layer 120, the embedded epitaxial layers are selectively formed in the grooves 110 when the embedded epitaxial layers are formed, and no embedded epitaxial layers are formed on the surface of the hard mask layer. The embedded epitaxial layers are usually formed by three sub-epitaxial layers, which are respectively a seed layer, a main body layer and a cover layer.

Specifically, please refer to FIG. 1b. Firstly, a seed layer 111 is formed in the grooves 110 by adopting an epitaxial growth process. Referring to FIG. 1c, a main body layer 112 is formed on the seed layer 111. Referring to FIG. 1d, a cover layer 113 is formed on the main body layer 112. The seed layer 111 is usually formed on the inner side surfaces of the grooves 110, the main body layer 112 fills the grooves 110, and the cover layer 113 covers the top of the main body layer 112 and usually extends to the tops of the grooves 110.

Referring to FIG. 1b, when the seed layer 111 is formed close to the walls of the grooves 110, since the growth speed of crystal faces <100> and <110> is different, the thickness of the seed layer 111 on the inner bottoms of the grooves 110 is very great and the thickness of the seed layer 111 on the sidewalls is very small. This is not conducive to the sidewalls to block carrier diffusion, and reduces the volume of the main body layer 112, resulting in the reduction of stress and thus reducing the performance of the device.

The same problem exists in the formation of source and drain region epitaxial layers of an NMOS device.

BRIEF SUMMARY OF THE DISCLOSURE

According to some embodiments in this application, an epitaxial growth process for a semiconductor device is disclosed in the following steps: S1: providing a semiconductor substrate, forming a plurality of Dummy Gate structures on the surface of the semiconductor substrate, and forming grooves in a self-aligned manner on both sides of the Dummy Gate structures through an etching process; S2: forming an initial seed layer on the inner side surfaces of the grooves through an epitaxial growth process, the thickness of the formed initial seed layer on the bottoms of the grooves being greater and the thickness of the formed initial seed layer on the sidewalls being smaller since the growth speed of crystal faces <100> and <110> is different; S3: performing an etching process to longitudinally etch the initial seed layer to thin the bottom of the initial seed layer to form a seed layer; S4: forming a main body layer on the seed layer through an epitaxial growth process, the main body layer filling the grooves; and S5: forming a cover layer on the main body layer through an epitaxial growth process.

The disclosure further provides a semiconductor device, which includes a source and drain region epitaxial layer formed by adopting the epitaxial growth process for the semiconductor device, wherein the thickness of the bottom of the seed layer of the source and drain region epitaxial layer is within 5 nm-15 nm.

BRIEF DESCRIPTION OF THE DRAWINGS

FIG. 2 is a flowchart of an epitaxial growth process for a semiconductor device according to one embodiment of the disclosure.

DETAILED DESCRIPTION OF THE DISCLOSURE

The technical solution of the disclosure will be described below clearly and completely with reference to the drawings. Apparently, the described embodiments are partial embodiments of the disclosure, instead of all embodiments. Based on the embodiments of the disclosure, all other embodiments obtained by those skilled in the art without contributing any inventive labor shall fall into the scope of protection of the disclosure.

In one embodiment of the disclosure, an epitaxial growth process for a semiconductor device is provided and includes the following steps: S1: providing a semiconductor substrate, forming a plurality of Dummy Gate structures on the surface of the semiconductor substrate, and forming grooves in a self-aligned manner in the two sides of the Dummy Gate structures through an etching process; S2: forming an initial seed layer on the inner side surfaces of the grooves through an epitaxial growth process, the thickness of the formed initial seed layer on the bottoms of the grooves being greater and the thickness of the formed initial seed layer on the sidewalls being smaller since the growth speed of crystal faces <100> and <110> is different; S3: performing an etching process to longitudinally etch the initial seed layer to thin the bottom of the initial seed layer to form a seed layer; S4: forming a main body layer on the seed layer through an epitaxial growth process, the main body layer filling the grooves; and S5: forming a cover layer on the main body layer through an epitaxial growth process.

Figure 3A:
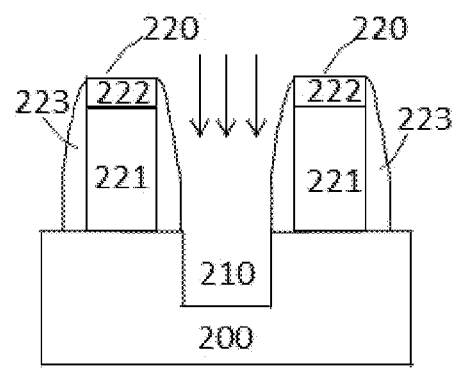
FIG. 3a to FIG. 3d are schematic sectional views of a semiconductor device in an epitaxial growth process for a semiconductor device according to one embodiment of the disclosure.

Please refer to FIG. 2 and FIG. 3a to FIG. 3d. FIG. 2 is a flowchart of an epitaxial growth process for a semiconductor device according to one embodiment of the disclosure. FIG. 3a to FIG. 3d are schematic sectional views of a semiconductor device in the epitaxial growth process for the semiconductor device according to one embodiment of the disclosure. The epitaxial growth process for the semiconductor device according to the disclosure includes:

In step S1, referring to FIG. 3a, a semiconductor substrate 200 is provided, a plurality of Dummy Gate structures 220 are formed on the surface of the semiconductor substrate 200, and grooves 210 are formed in a self-aligned manner on both sides of the Dummy Gate structures 220 through an etching process.

In one embodiment, the semiconductor substrate 200 is a silicon substrate.

In one embodiment, each Dummy Gate structure 220 includes a polysilicon layer 221 formed on the surface of the semiconductor substrate 200, and generally further includes a gate dielectric layer between the polysilicon layer 221 and the semiconductor substrate 200. Referring to FIG. 3a, and generally it further includes a hard mask layer 222 on the polysilicon layer 221, and sidewalls 223 on both sides of the polysilicon layer 221 and the hard mask layer 222. Grooves 210 are formed on both sides of the Dummy Gate structure 220. In one embodiment, the grooves 210 are formed through a dry etching process. In one embodiment, the grooves 210 are in a Σ-shaped structure or a U-shaped structure.

Figure 3B:
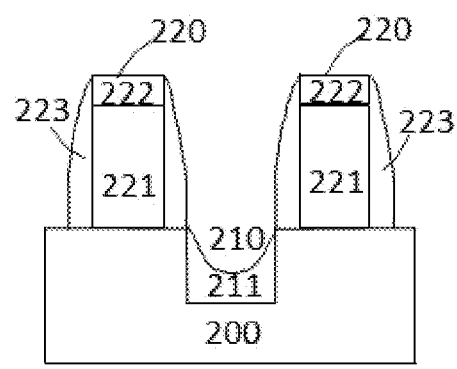

In step S2, referring to FIG. 3b, an initial seed layer 211 is formed on the inner side surfaces of the grooves 210 through an epitaxial growth process, the thickness of the formed initial seed layer 211 on the bottoms of the grooves 210 is greater and the thickness of the formed initial seed layer 211 on the sidewalls is smaller since the growth speed of crystal faces <100> and <110> is different.

Figure 3C:
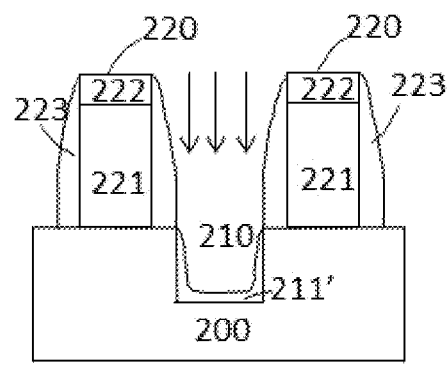

In step S3, referring to FIG. 3c, an etching process is performed to longitudinally etch the initial seed layer 211 to thin the bottom of the initial seed layer 211 to form a seed layer 211'.

In one embodiment, the thickness of the bottom of the initial seed layer 211 is within 15 nm-30 nm and the thickness of the bottom of the seed layer 211' is within 5 nm-15 nm.

Figure 3D:
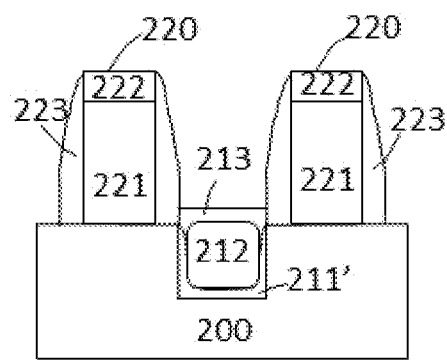

In step S4, referring to FIG. 3d, a main body layer 212 is formed on the seed layer 211' through an epitaxial growth process, and the main body layer 212 fills the grooves 210.

Figure 1A:
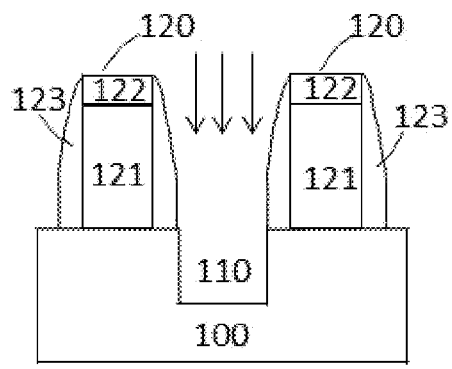
FIG. 1a to FIG. 1d are schematic sectional views of devices in an embedded epitaxial layer forming process in the prior art.
Figure 1B:
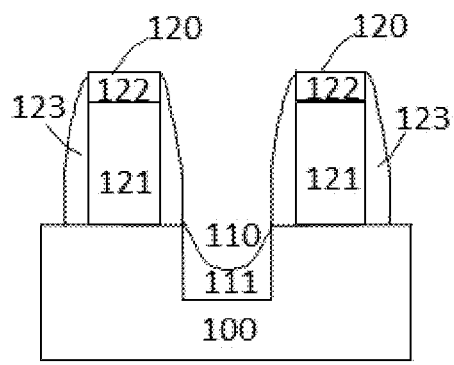
Figure 1C:
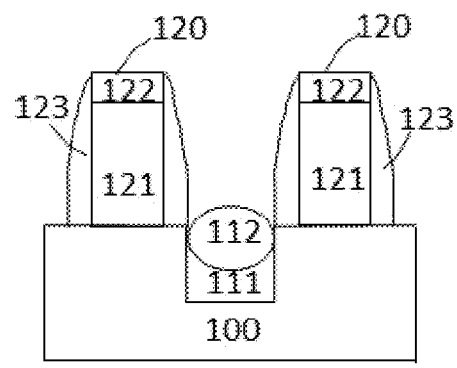
Figure 1D:
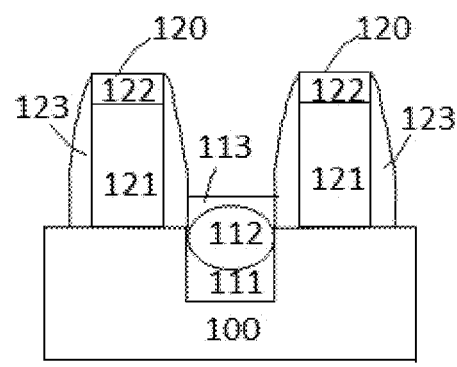

Referring to FIG. 3D, since the bottom of the initial seed layer 211 has been thinned in step S3, the volume of the formed seed layer 211' is smaller than that of the seed layer 111 in FIG. 1D in the prior art, and accordingly the volume of the formed main body layer 212 is larger than that of the main body layer 112 formed in the prior art.

In step S5, referring to FIG. 3d, a cover layer 213 is formed on the main body layer 212 through an epitaxial growth process.

In one embodiment, the epitaxial growth process is a selective epitaxial growth process, and epitaxial layers are formed only in the grooves. In one embodiment, the temperature range of the epitaxial growth process is 500° C.-800° C. and the pressure is within 1 torr-100 torr.

In one embodiment, gas used in the epitaxial growth process includes SiH2Cl2 or SiH4, GeH4, PH3, HCL, H2, and N2, wherein H2 and N2 are carrier gas, the flow rate of carrier gas H2 and N2 is within 1 slm-50 slm, and the flow rate of other gas is within 1 sccm-1000 sccm.

In one embodiment, the seed layer 211', the main body layer 212 and the cover layer 213 are germanium-silicon epitaxial layers, the germanium-silicon epitaxial layers are source and drain embedded epitaxial layers forming a PMOS transistor to improve the hole mobility of a channel region of the PMOS transistor, a source region and a drain region of the PMOS transistor are formed in the germanium-silicon epitaxial layers, Dummy Gate structures 220 or gate structures of the PMOS transistor are formed between two grooves in which the germanium-silicon epitaxial layers are formed, the Dummy Gate structures are stacking structures 220 of gate dielectric layers and polysilicon gates, and the gate structures are stacking structures of gate dielectric layers and metal gates.

In one embodiment, the seed layer 211', the main body layer 212 and the cover layer 213 are germanium-silicon-boron epitaxial layers, the germanium-silicon-boron epitaxial layers are source and drain embedded epitaxial layers forming a PMOS transistor to improve the hole mobility of a channel region of the PMOS transistor, a source region and a drain region of the PMOS transistor are formed in the germanium-silicon-boron epitaxial layers, Dummy Gate structures 220 or gate structures of the PMOS transistor are formed between two grooves in which the germanium-silicon-boron epitaxial layers are formed, the Dummy Gate structures 220 are stacking structures of gate dielectric layers and polysilicon gates, and the gate structures are stacking structures of gate dielectric layers and metal gates.

In one embodiment, the seed layer 211', the main body layer 212 and the cover layer 213 are phosphorus-silicon epitaxial layers, the phosphorus-silicon epitaxial layers are source and drain embedded epitaxial layers forming an NMOS transistor to improve the electron mobility of a channel region of the NMOS transistor, a source region and a drain region of the NMOS transistor are formed in the phosphorus-silicon epitaxial layers, Dummy Gate structures 220 or gate structures are formed between two grooves in which the phosphorus-silicon epitaxial layers are formed, the Dummy Gate structures 220 are stacking structures of gate dielectric layers and polysilicon gates, and the gate structures are stacking structures of gate dielectric layers and metal gates.

In one embodiment, a semiconductor device is further provided. The semiconductor device includes a source and drain region epitaxial layer formed by adopting the epitaxial growth process for the semiconductor device, wherein the thickness of the bottom of the seed layer of the source and drain region epitaxial layer is within 5 nm-15 nm.

In one embodiment, the semiconductor device is a PMOS transistor, the source and drain embedded epitaxial layers are germanium-silicon epitaxial layers, the source and drain embedded epitaxial layers are used to improve the hole mobility of a channel region of the PMOS transistor, a source region and a drain region of the PMOS transistor are formed in the source and drain embedded epitaxial layers, Dummy Gate structures 220 or gate structures of the PMOS transistor are formed between the source and drain embedded epitaxial layers, the Dummy Gate structures 220 are stacking structures of gate dielectric layers and polysilicon gates, and the gate structures are stacking structures of gate dielectric layers and metal gates.

In one embodiment, the semiconductor device is a PMOS transistor, the source and drain embedded epitaxial layers are germanium-silicon-boron epitaxial layers, the source and drain embedded epitaxial layers are used to improve the hole mobility of a channel region of the PMOS transistor, a source region and a drain region of the PMOS transistor are formed in the source and drain embedded epitaxial layers, Dummy Gate structures 220 or gate structures of the PMOS transistor are formed between the source and drain embedded epitaxial layers, the Dummy Gate structures 220 are stacking structures of gate dielectric layers and polysilicon gates, and the gate structures are stacking structures of gate dielectric layers and metal gates.

In one embodiment, the semiconductor device is an NMOS transistor, the source and drain embedded epitaxial layers are phosphorus-silicon epitaxial layers, the source and drain embedded epitaxial layers are used to improve the electron mobility of a channel region of the NMOS transistor, a source region and a drain region of the NMOS transistor are formed in the source and drain embedded epitaxial layers, Dummy Gate structures 220 or gate structures of the NMOS transistor are formed between the source and drain embedded epitaxial layers, the Dummy Gate structures 220 are stacking structures of gate dielectric layers and polysilicon gates, and the gate structures are stacking structures of gate dielectric layers and metal gates.

In one embodiment, the process node of the NMOS transistor and the PMOS transistor is 28 nm, 14 nm or smaller. For example, the NMOS transistor and PMOS transistor are 28 LP, i.e., 28 nm low power consumption devices, or the NMOS transistor and PMOS transistor are 28 HKMG, i.e., 28 nm HKMG devices. In one embodiment, the NMOS transistor and PMOS transistor are 14 nm FINFET structures.

As described above, in the epitaxial growth process for the semiconductor device, after the initial seed layer is formed in the grooves, by longitudinally etching the bottom of the initial seed layer, the bottom of the initial seed layer is thinned to form the final seed layer, and then the main body layer and the cover layer are formed. In this way, when forming the initial seed layer, the thickness of the sidewalls can be increased to make the thickness of the sidewalls meet the specification, then by thinning the bottom of the initial seed layer, the thickness of the bottom of the initial seed layer meets the specification. On the basis of effectively isolating the main body layer from being conducted with channels through carriers in a static state such that the leakage current is reduced, the thickness of the main body layer can be increased as much as possible, the channel stress is enhanced and the electrical performance of the device is improved.

Finally, it should be noted that the above embodiments are only used for describing instead of limiting the technical solution of the disclosure. Although the disclosure has been described in detail with reference to the above embodiments, those skilled in the art should understand that they can still modify the technical solution recorded in the above embodiments, or equivalently replace some or all of the technical features. However, these modifications or replacements do not make the essence of the corresponding technical solution departed from the scope of the technical solution of each embodiment of the disclosure.

What is claimed is:

1. An epitaxial growth process for a semiconductor device, comprising steps of:
    S1: providing a semiconductor substrate, forming a plurality of Dummy Gate structures on a surface of the semiconductor substrate, and forming grooves in a self-aligned manner on both sides of the Dummy Gate structures through an etching process;
    S2: forming an initial seed layer on an inner side surfaces of the grooves through an epitaxial growth process, a thickness of the formed initial seed layer on bottoms of the grooves being greater and a thickness of the formed initial seed layer on sidewalls being smaller since a growth speed of crystal faces <100> and <110> is different, wherein a side wall thickness of the initial seed layer meets specification requirements, and a bottom thickness of the initial seed layer is greater than the specification requirements;
    S3: performing an etching process to longitudinally etch the initial seed layer to thin a bottom of the initial seed layer to form a seed layer, wherein the etching process is anisotropic etching in which a longitudinal etching rate is greater than a traverse etching rate, and after the etching process is completed, the bottom thickness of the seed layer meets the specification requirements, and a sidewall thickness of the seed layer is maintained to meet the specification requirements;
    S4: forming a main body layer on the seed layer through an epitaxial growth process, the main body layer filling the grooves; and
    S5: forming a cover layer on the main body layer through an epitaxial growth process.

2. The epitaxial growth process for the semiconductor device according to claim 1, wherein the grooves are formed through a dry etching process.

3. The epitaxial growth process for the semiconductor device according to claim 1, wherein the grooves are in a Σ-shaped structure or a U-shaped structure.

4. The epitaxial growth process for the semiconductor device according to claim 1, wherein the bottom thickness of the initial seed layer is within 15 nm-30 nm and the bottom thickness of the seed layer is within 5 nm-15 nm.

5. The epitaxial growth process for the semiconductor device according to claim 1, wherein the epitaxial growth process in step S2, step S4, and step S5 is a selective epitaxial growth process.

6. The epitaxial growth process for the semiconductor device according to claim 5, wherein a temperature range of the epitaxial growth process is within 500° C.-800° C. and a pressure is within 1 torr-100 torr.

7. The epitaxial growth process for the semiconductor device according to claim 5, wherein gas used in the epitaxial growth process comprises SiH2Cl2 or SiH4, GeH4, PH3, HCL, H2, and N2, wherein H2 and N2 are carrier gas, a flow rate of carrier gas H2 and N2 is within 1 slm-50 slm, and a flow rate of other gas is within 1 sccm-1000 sccm.

8. The epitaxial growth process for the semiconductor device according to claim 1, wherein the seed layer, the main body layer, and the cover layer are germanium-silicon epitaxial layers, the germanium-silicon epitaxial layers are source and drain embedded epitaxial layers forming a PMOS transistor to improve a hole mobility of a channel region of the PMOS transistor, a source region and a drain region of the PMOS transistor are formed in the germanium-silicon epitaxial layers, Dummy Gate structures or gate structures of the PMOS transistor are formed between two grooves in which the germanium-silicon epitaxial layers are formed, the Dummy Gate structures are stacking structures of gate dielectric layers and polysilicon gates, and the gate structures are stacking structures of gate dielectric layers and metal gates.

9. The epitaxial growth process for the semiconductor device according to claim 1, wherein the seed layer, the main body layer, and the cover layer are germanium-silicon-boron epitaxial layers, the germanium-silicon-boron epitaxial layers are source and drain embedded epitaxial layers forming a PMOS transistor to improve a hole mobility of a channel region of the PMOS transistor, a source region and a drain region of the PMOS transistor are formed in the germanium-silicon-boron epitaxial layers, Dummy Gate structures or gate structures of the PMOS transistor are formed between two grooves in which the germanium-silicon-boron epitaxial layers are formed, the Dummy Gate structures are stacking structures of gate dielectric layers and polysilicon gates, and the gate structures are stacking structures of gate dielectric layers and metal gates.

10. The epitaxial growth process for the semiconductor device according to claim 1, wherein the seed layer, the main body layer, and the cover layer are phosphorus-silicon epitaxial layers, the phosphorus-silicon epitaxial layers are source and drain embedded epitaxial layers forming an NMOS transistor to improve an electron mobility of a channel region of the NMOS transistor, a source region and a drain region of the NMOS transistor are formed in the phosphorus-silicon epitaxial layers, Dummy Gate structures or gate structures are formed between two grooves in which the phosphorus-silicon epitaxial layers are formed, the Dummy Gate structures are stacking structures of gate dielectric layers and polysilicon gates, and the gate structures are stacking structures of gate dielectric layers and metal gates.

11. The epitaxial growth process for the semiconductor device according to claim 8, wherein a process node of the PMOS transistor is 28 nm, 14 nm or smaller.

12. The epitaxial growth process for the semiconductor device according to claim 9, wherein a process node of the PMOS transistor is 28 nm, 14 nm or smaller.

13. The epitaxial growth process for the semiconductor device according to claim 10, wherein a process node of the NMOS transistor is 28 nm, 14 nm or smaller.

14. A semiconductor device, wherein the semiconductor device comprises source and drain embedded epitaxial layers formed by adopting the epitaxial growth process for the semiconductor device according to claim 1, wherein a thickness of a bottom of a seed layer of the source and drain embedded epitaxial layers is within 5 nm-15 nm.

15. The semiconductor device according to claim 14, wherein the semiconductor device is a PMOS transistor, the source and drain embedded epitaxial layers are germanium-silicon epitaxial layers, the source and drain embedded epitaxial layers are used to improve a hole mobility of a channel region of the PMOS transistor, a source region and a drain region of the PMOS transistor are formed in the source and drain embedded epitaxial layers, Dummy Gate structures or gate structures of the PMOS transistor are formed between the source and drain embedded epitaxial layers, the Dummy Gate structures are stacking structures of gate dielectric layers and polysilicon gates, and the gate structures are stacking structures of gate dielectric layers and metal gates.

16. The semiconductor device according to claim 14, wherein the semiconductor device is a PMOS transistor, the source and drain embedded epitaxial layers are germanium-silicon-boron epitaxial layers, the source and drain embedded epitaxial layers are used to improve a hole mobility of a channel region of the PMOS transistor, a source region and a drain region of the PMOS transistor are formed in the source and drain embedded epitaxial layers, Dummy Gate structures or gate structures of the PMOS transistor are formed between the source and drain embedded epitaxial layers, the Dummy Gate structures are stacking structures of gate dielectric layers and polysilicon gates, and the gate structures are stacking structures of gate dielectric layers and metal gates.

17. The semiconductor device according to claim 14, wherein the semiconductor device is an NMOS transistor, the source and drain embedded epitaxial layers are phosphorus-silicon epitaxial layers, the source and drain embedded epitaxial layers are used to improve an electron mobility of a channel region of the NMOS transistor, a source region and a drain region of the NMOS transistor are formed in the source and drain embedded epitaxial layers, Dummy Gate structures or gate structures of the NMOS transistor are formed between the source and drain embedded epitaxial layers, the Dummy Gate structures are stacking structures of gate dielectric layers and polysilicon gates, and the gate structures are stacking structures of gate dielectric layers and metal gates.

* * * * *